(12) United States Patent
Xue (10) Patent No.: US 11,328,530 B2
(45) Date of Patent: May 10, 2022

(54) FINGERPRINT RECOGNITION DEVICE, MANUFACTURING METHOD THEREOF, AND DISPLAY PANEL

(71) Applicant: BOE TECHNOLOGY GROUP CO., LTD., Beijing (CN)

(72) Inventor: Dapeng Xue, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 278 days.

(21) Appl. No.: 16/495,547

(22) PCT Filed: Apr. 12, 2019

(86) PCT No.: PCT/CN2019/082433
§ 371 (c)(1),
(2) Date: Sep. 19, 2019

(87) PCT Pub. No.: WO2019/205961
PCT Pub. Date: Oct. 31, 2019

(65) Prior Publication Data
US 2021/0334499 A1    Oct. 28, 2021

(30) Foreign Application Priority Data
Apr. 27, 2018 (CN) .......................... 201810390656.7

(51) Int. Cl.
*H01L 27/146* (2006.01)
*G06V 40/13* (2022.01)

(52) U.S. Cl.
CPC ...... *G06V 40/1318* (2022.01); *H01L 27/1461* (2013.01); *H01L 27/14629* (2013.01); *H01L 27/14643* (2013.01); *H01L 27/14689* (2013.01)

(58) Field of Classification Search
CPC .............. G06K 9/0004; H01L 27/1461; H01L 27/14643
See application file for complete search history.

(56) References Cited

U.S. PATENT DOCUMENTS

2015/0153483 A1*  6/2015  Endoh ...................... G02B 1/12
                                                        359/601
2015/0369661 A1*  12/2015  Lin ...................... G06K 9/0004
                                                        250/227.11
(Continued)

FOREIGN PATENT DOCUMENTS

CN          201549509 U     8/2010
CN          105140250 A     12/2015
(Continued)

OTHER PUBLICATIONS

International Search Report received for PCT Patent Application No. PCT/CN2019/082433, dated Jul. 1, 2019, 6 pages (2 pages of English Translation and 4 pages of Original Document).

*Primary Examiner* — Thanh Luu
(74) *Attorney, Agent, or Firm* — Womble Bond Dickinson (US) LLP (57) ABSTRACT

A fingerprint recognition device includes a first substrate and at least one photosensitive detector on the first substrate, each of the at least one photosensitive detector including a first electrode, a photosensitive layer on the first electrode, and a second electrode on the photosensitive layer. A side of the photosensitive layer facing away from the first electrode has a curved shape.

16 Claims, 6 Drawing Sheets

(56) References Cited

U.S. PATENT DOCUMENTS

2017/0236857 A1    8/2017   Bu
2019/0005295 A1    1/2019   Jia et al.

FOREIGN PATENT DOCUMENTS

| CN | 106611170 A | 5/2017 |
| CN | 206975658 U | 2/2018 |
| CN | 108596113 A | 9/2018 |

* cited by examiner

FINGERPRINT RECOGNITION DEVICE, MANUFACTURING METHOD THEREOF, AND DISPLAY PANEL

CROSS-REFERENCE TO RELATED APPLICATIONS

The present application is a 35 U.S.C. 371 national stage application of PCT International Application No. PCT/CN2019/082433, filed on Apr. 12, 2019, which claims priority to Chinese Patent Application No. 201810390656.7 filed on Apr. 27, 2018, the entire disclosures of which are incorporated herein by reference.

TECHNICAL FIELD

The present disclosure relates to the field of semiconductor technologies, and in particular, to a fingerprint recognition device, a method of manufacturing the same, and a display panel.

BACKGROUND

At present, fingerprint recognition applied in electronic devices is generally based on optical technology, silicon technology (capacitive or radio frequency) or ultrasonic technology. For capacitive fingerprint recognition, oftentimes parasitic capacitances occur between the electrodes at both ends of the capacitor and internal components of the display panel in the electronic device, which parasitic capacitances sometimes cause crosstalk between a fingerprint detection signal and a display signal, thereby affecting the accuracy of fingerprint recognition. In fingerprint recognition based on optical technology, the detection and recognition of fingerprints is realized by optical sensors detecting light reflected from human fingers, and thus generally does not suffer from signal crosstalk. However, existing optical fingerprint recognition sensors have problems of poor sensitivity and accuracy.

SUMMARY

According to some embodiments of the present disclosure, a fingerprint recognition device is provided comprising: a first substrate; and at least one photosensitive detector on the first substrate, each of the at least one photosensitive detector comprising a first electrode, a photosensitive layer on the first electrode, and a second electrode on the photosensitive layer. A side of the photosensitive layer facing away from the first electrode has a curved shape.

In some embodiments, the photosensitive layer comprises: an N-type semiconductor layer; an intrinsic semiconductor layer on the N-type semiconductor layer; and a P-type semiconductor layer on the intrinsic semiconductor layer. A side of the P-type semiconductor layer facing away from the first electrode has the curved shape.

In some embodiments, the curved shape comprises at least one selected from a group consisting of a concave arced surface, a convex arced surface, and a wavy surface.

In some embodiments, each of the at least one photosensitive detector further comprises a respective loop-shaped frame on the photosensitive layer, and the loop-shaped frame has a reflective inner surface such that light impinging on the inner surface is reflected to the photosensitive layer.

In some embodiments, the loop-shaped frame is arranged such that an orthographic projection of the loop-shaped frame onto the first substrate overlaps an orthographic projection of a peripheral region of the photosensitive layer onto the first substrate.

In some embodiments, the loop-shaped frame is made of a material comprising at least one selected from a group consisting of Mo, Al, Nb, and Ti.

In some embodiments, the loop-shaped frame surrounds at least a portion of the second electrode, and the second electrode is in contact with the photosensitive layer via the at least the portion surrounded by the loop-shaped frame.

In some embodiments, the fingerprint recognition device further comprises a second substrate opposite the first substrate and on the second electrode.

In some embodiments, the fingerprint recognition device further comprises at least one thin film transistor on the first substrate, wherein each of the at least one thin film transistor is electrically connected to the first electrode of a respective photosensitive detector of the at least one photosensitive detector to transfer an output signal from the respective photosensitive detector for fingerprint recognition.

According to some embodiments of the present disclosure, a display panel is provided comprising the fingerprint recognition device as described above.

According to some embodiments of the present disclosure, a method of manufacturing a fingerprint recognition device is provided, comprising: forming a first electrode on a first substrate; forming a photosensitive layer on the first electrode; patterning a side of the photosensitive layer facing away from the first electrode into a curved shape; and forming a second electrode on the patterned photosensitive layer.

In some embodiments, the photosensitive layer comprises an N-type semiconductor layer, an intrinsic semiconductor layer on the N-type semiconductor layer, and a P-type semiconductor layer on the intrinsic semiconductor layer. The patterning comprises: forming a photoresist layer on the P-type semiconductor layer; patterning a side of the photoresist layer facing away from the P-type semiconductor layer into the curved shape; and performing dry etching to remove the photoresist layer and to etch a side of the P-type semiconductor layer facing away from the first electrode into the curved shape.

In some embodiments, the dry etching comprises a plurality of cycles of etching and ashing.

In some embodiments, the dry etching is performed such that the P-type semiconductor layer has a minimum thickness greater than a threshold.

DETAILED DESCRIPTION

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. Terms such as "before" or "preceding" and "after" or "followed by" may be similarly used, for example, to indicate an order in which light passes through the elements. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. In no event, however, should "on" or "directly on" be construed as requiring a layer to completely cover an underlying layer.

Embodiments of the disclosure are described herein with reference to schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Detailed descriptions of known components may have been omitted in order to render the following description of the embodiments of the present disclosure clear and concise.

Figure 1:
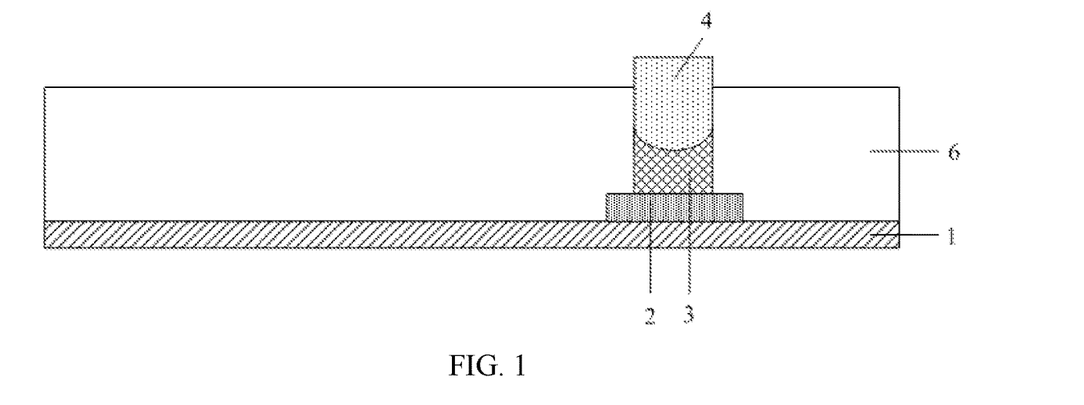
FIG. 1 is a schematic cross-sectional view of a fingerprint recognition device in accordance with an embodiment of the present disclosure.

FIG. 1 is a schematic cross-sectional view of a fingerprint recognition device in accordance with an embodiment of the present disclosure. Referring to FIG. 1, the fingerprint recognition device includes a first substrate 1 and a photosensitive detector on the first substrate 1.

The first substrate 1 may be made of any suitable material such as glass or resin.

The photosensitive detector includes a first electrode 2, a photosensitive layer 3 on the first electrode 2, and a second electrode 4 on the photosensitive layer 3. A side of the photosensitive layer 3 facing away from the first electrode 2 has a curved shape, as shown in FIG. 1. The second electrode 4 may be made of a transparent conductive material, for example, a metal oxide such as ITO, IZO or IGZO.

When performing fingerprint recognition, a finger is generally positioned above the fingerprint recognition device, and a side of the photosensitive layer facing away from the first electrode 2 (i.e., facing the finger) receives ambient light reflected by the finger. Thereby, the photosensitive detector produces an output signal for fingerprint recognition. By setting the side of the photosensitive layer 3 facing away from the first electrode 2 to be curved, a light receiving area of the fingerprint recognition device can be increased, thereby improving the sensitivity and accuracy of the fingerprint recognition device.

It will be understood that although the fingerprint recognition device is illustrated in FIG. 1 as including a single photosensitive detector, this is merely exemplary and illustrative. In other embodiments, the fingerprint recognition device may include any suitable number of photosensitive detectors. The fingerprint recognition device may be applied in any suitable scenarios, for example, in an access control system, an attendance system, a notebook computer, a mobile phone, an automobile, bank payment, and the like.

Figure 2A:
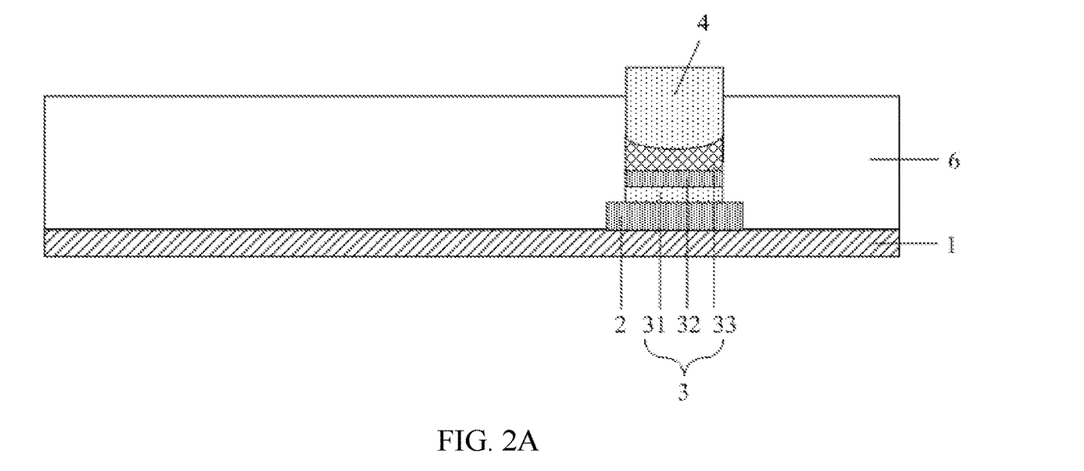
FIG. 2A is a schematic cross-sectional view showing an example structure of a photosensitive layer in the fingerprint recognition device of FIG. 1.

FIG. 2A is a schematic cross-sectional view showing an example structure of the photosensitive layer 3 in the fingerprint recognition device of FIG. 1. Referring to FIG. 2A, the photosensitive layer 3 includes an N-type semiconductor layer 31, an intrinsic semiconductor layer 32 on the N-type semiconductor layer 31, and a P-type semiconductor layer 33 on the intrinsic semiconductor layer 32. This way, the photosensitive layer 3 forms a PIN photodiode. A side of the P-type semiconductor layer 33 of the photosensitive layer 3 facing away from the first electrode 2 has a curved shape.

In other embodiments, the photosensitive layer 3 may have a layered structure different from that shown, as long as the side of the photosensitive layer 3 facing the second electrode 4 is provided in a curved shape.

Figure 2B:
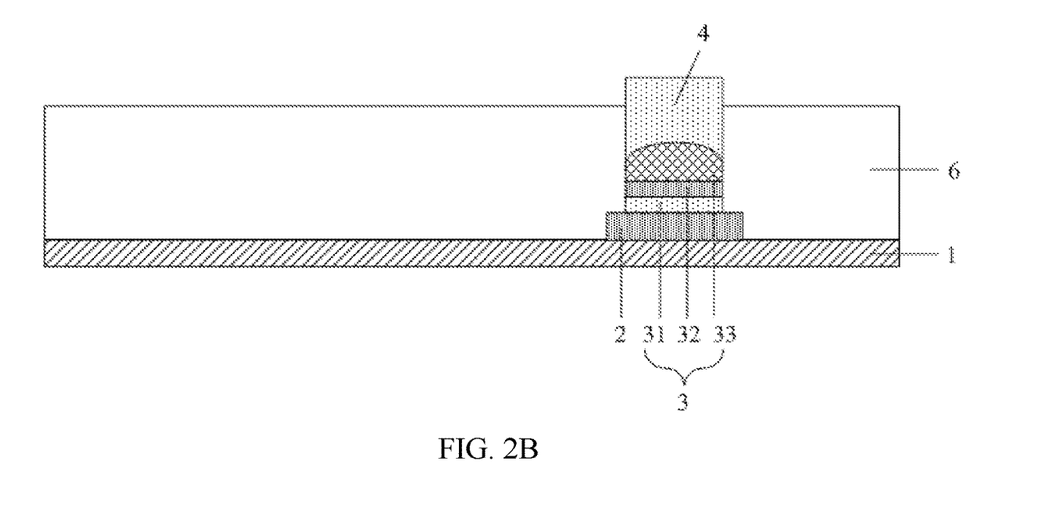
FIG. 2B is a schematic cross-sectional view of a variation of the fingerprint recognition device of FIG. 2A.
Figure 2C:
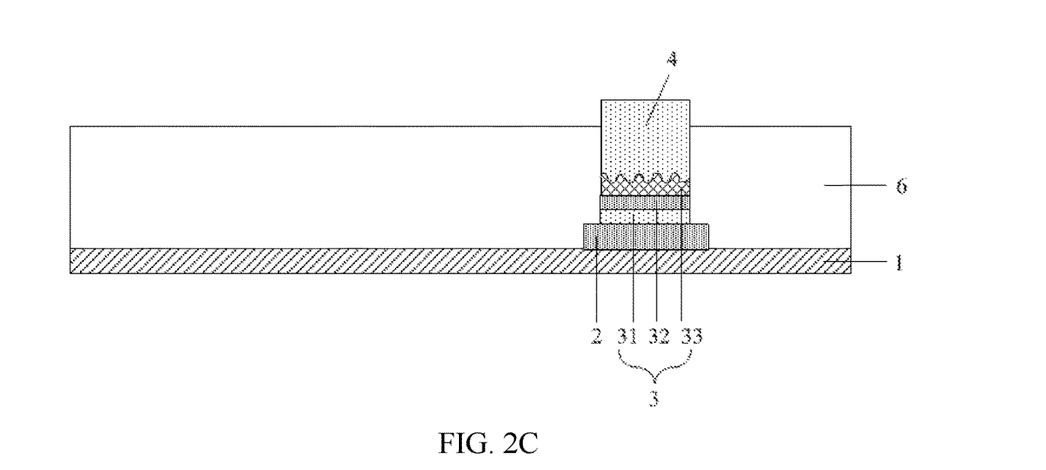
FIG. 2C is a schematic cross-sectional view of another variation of the fingerprint recognition device of FIG. 2A.

FIGS. 2B and 2C show variations of the fingerprint recognition device of FIG. 2A. In the example of FIG. 2B, the curved shape of the photosensitive layer 3 is a convex arced surface. In the example of FIG. 2C, the curved shape of the photosensitive layer 3 is a wavy surface. Other curved shapes are also possible, and the disclosure is not limited thereto.

Figure 3:
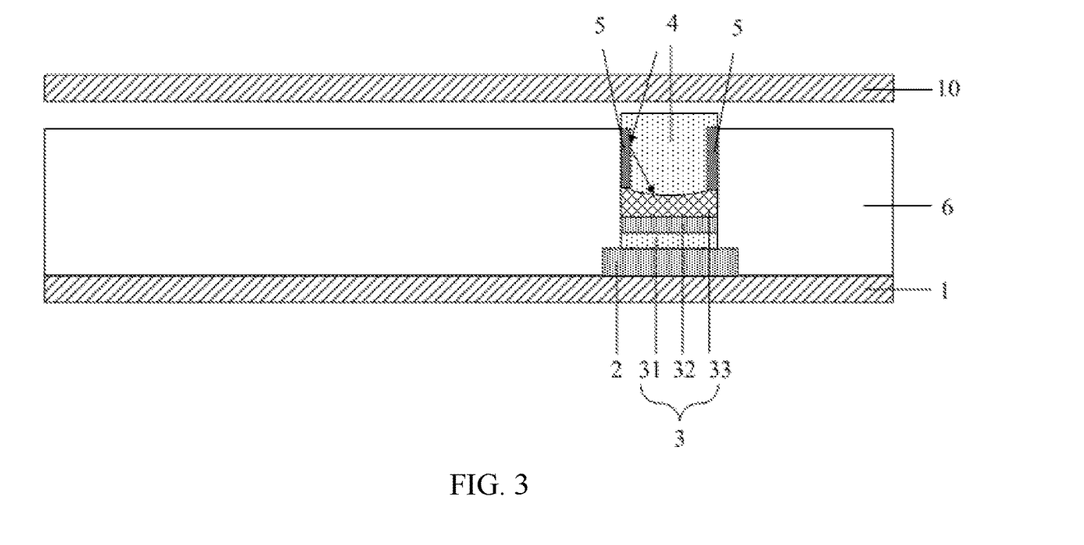
FIG. 3 is a schematic cross-sectional view of a fingerprint recognition device provided with a loop-shaped frame in accordance with an embodiment of the present disclosure.

FIG. 3 is a schematic cross-sectional view of a fingerprint recognition device provided with a loop-shaped frame in accordance with an embodiment of the present disclosure. In this embodiment, the loop-shaped frame 5 is disposed on the photosensitive layer 3.

The loop-shaped frame 5 has a reflective inner surface such that light impinging on the inner surface is reflected to the photosensitive layer 3 (specifically, the P-type semiconductor layer 33). As shown in FIG. 3, the light indicated by the arrows would otherwise not be received by the photosensitive layer 3. With the loop-shaped frame 5, the light is reflected to the upper surface of the photosensitive layer 3. Thereby, the sensitivity of the fingerprint recognition device is improved.

In this example, the loop-shaped frame 5 surrounds at least a portion of the second electrode 4, and the second electrode 4 is in contact with the photosensitive layer 3 (specifically, the P-type semiconductor layer 33) via the at least the portion surrounded by the loop-shaped frame 5. Accordingly, an orthographic projection of the loop-shaped frame 5 onto the first substrate 1 overlaps an orthographic projection of a peripheral region of the photosensitive layer 3 onto the first substrate 1. It will be understood that the term loop-shaped does not mean that the frame 5 necessarily has a circular shape when viewed from above, but may have any suitable closed shape.

The loop-shaped frame 5 may be made of one or more of Mo, Al, Nb, and Ti, that is, it may be made of a single metal or an alloy of a plurality of metals. Of course, in other embodiments, it may also be made of other materials that are opaque and have a reflective function. In a specific manufacture process, the loop-shaped frame 5 may be formed by first forming a reflective metal layer and then removing a central portion of the metal layer with an etching process.

In the example of FIG. 3, the fingerprint recognition device includes a first insulating layer 6 surrounding the first electrode 2, the photosensitive layer 3 and the loop-shaped frame 5. The second electrode 4 fills the space surrounded by the loop-shaped frame 5 and is in contact with the photosensitive layer 3. In addition, the fingerprint recognition device further includes a second substrate 10 opposite to the first substrate 1 and located on the second electrode 4.

Figure 4:
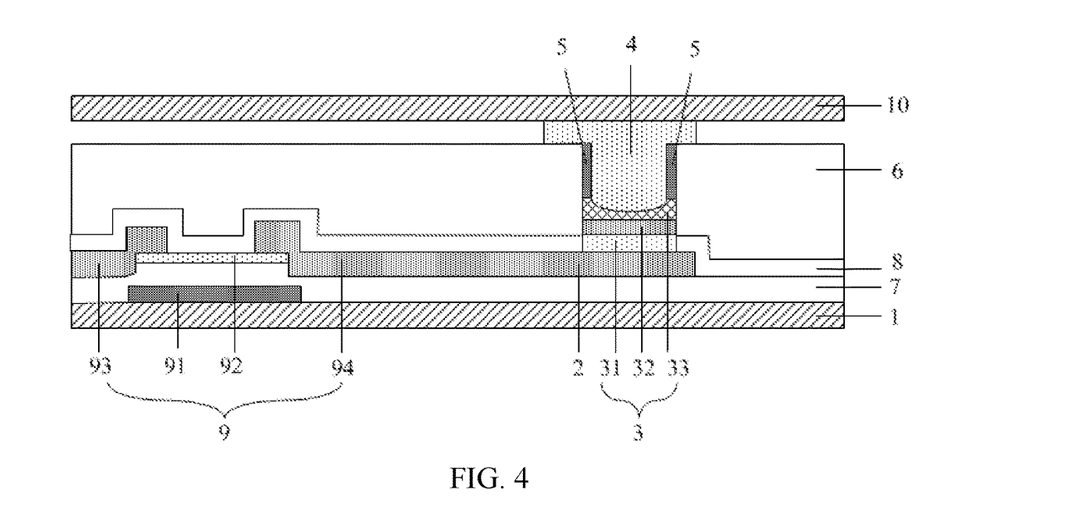
FIG. 4 is a schematic cross-sectional view of a display panel in accordance with an embodiment of the present disclosure.

FIG. 4 is a schematic cross-sectional view of a display panel in accordance with an embodiment of the present disclosure. In order not to obscure the subject matter of the present disclosure, elements in the display panel that are not related to the concept of the present disclosure are not shown in FIG. 4.

The second electrode 4 of the photosensitive detector may be of the same material and in the same layer as the pixel electrodes (not shown) in the display panel. Therefore, the second electrode of the photosensitive detector can be formed at the same time when the pixel electrodes are formed.

A thin film transistor 9 is disposed on the first substrate 1 for transferring an output signal from the photosensitive detector for fingerprint recognition. The thin film transistor 9 includes a gate electrode 91, an active layer 92 insulated from the gate electrode 91 via a second insulating layer 7, and a source electrode 93 and a drain electrode 94 that are in contact with the active layer 92. The drain electrode 94 of the thin film transistor 9 is connected to the first electrode 2 of the photosensitive detector. Accordingly, the drain electrode 94 of the thin film transistor 9 can be reused as the first electrode 2 of the photosensitive detector. In manufacturing the fingerprint recognition device, the first electrode 2 of the photosensitive detector may be formed at the same time when the drain electrode 94 of the thin film transistor 9 is formed. In this example, a third insulating layer 8 is further provided on the source electrode 93 and the drain electrode 94.

Although the thin film transistor 9 is shown in FIG. 4 as being of a bottom gate type, this is merely exemplary and illustrative. In other embodiments, the thin film transistor 9 may be of a top gate type. The thin film transistor 9 is typically made symmetrical such that its source electrode 94 and drain electrode 94 can be used interchangeably.

In an embodiment, the fingerprint recognition device may be integrated with the display panel. For example, the film layers of the thin film transistor in the fingerprint recognition device may be formed at the same time when the respective film layers of the thin film transistors in the pixels are formed. The photosensitive detector may be provided in a non-display area of the display panel, or alternatively in a display area of the display panel.

Figure 5:
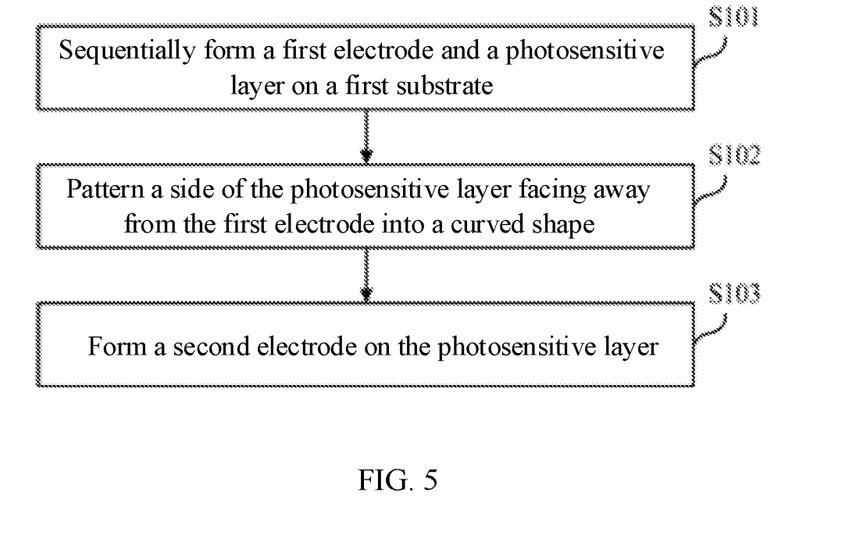
FIG. 5 is a flow chart of a method of manufacturing a fingerprint recognition device in accordance with an embodiment of the present disclosure.

FIG. 5 is a flow chart of a method of manufacturing a fingerprint recognition device in accordance with an embodiment of the present disclosure. For clarity of the description, the method is described below in connection with FIGS. 6 to 12.

At step S101, a first electrode and a photosensitive layer are sequentially formed on a first substrate. This may include multiple sub-steps.

Figure 6:
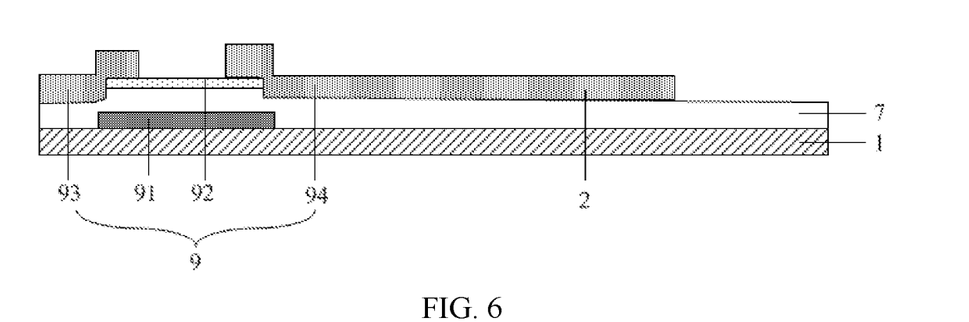
FIG. 6 is a schematic cross-sectional view showing a structure obtained by forming a first electrode according to the method of FIG. 5.

Step ①, a manufacturing the thin film transistor 9 on the first substrate 1. This includes forming the gate electrode 91, the active layer 92, and the source-drain electrode layer (including the source electrode 93 and the drain electrode 94) of the thin film transistor 9, with the second insulating layer 7 isolating the gate electrode 91 from the active layer 92. This step does not require a special process. The source electrode 93 and the drain electrode 94 are formed in synchronization with the first electrode 2 of the photosensitive detector, and the drain electrode 94 and the first electrode 2 are of an integral structure, as shown in FIG. 6.

Step ②, depositing the third insulating layer 8 on the source-drain electrode layer of the thin film transistor 9, and providing in the third insulating layer 8 a through-hole for the connection of the photosensitive layer 3 and the first electrode 2.

Figure 7:
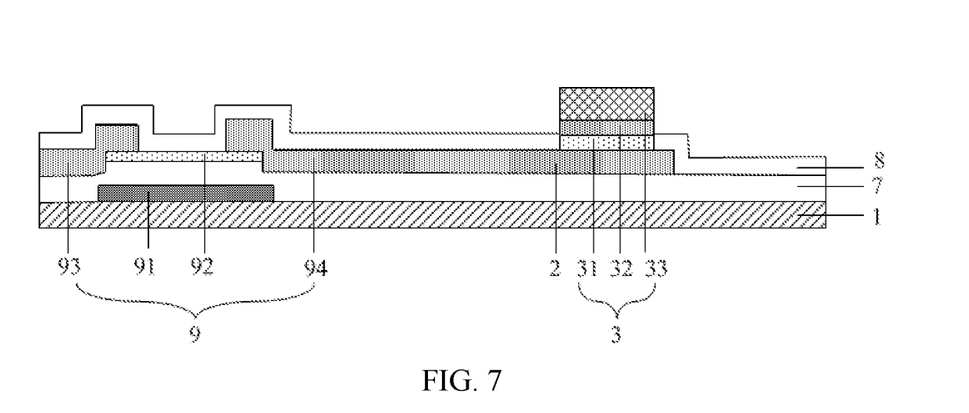
FIG. 7 is a schematic cross-sectional view showing a structure obtained by forming a photosensitive layer on the basis of the structure of FIG. 6.

Step ③, sequentially forming the N-type semiconductor layer 31, the intrinsic semiconductor layer 32, and the P-type semiconductor layer 33 in the through-hole of the third insulating layer 8 that are stacked on top of each other, obtaining the photosensitive layer 3, as shown in FIG. 7.

At step S102, a side of the photosensitive layer 3 facing away from the first electrode 2 is patterned into a curved shape. This may include multiple sub-steps.

Figure 8:
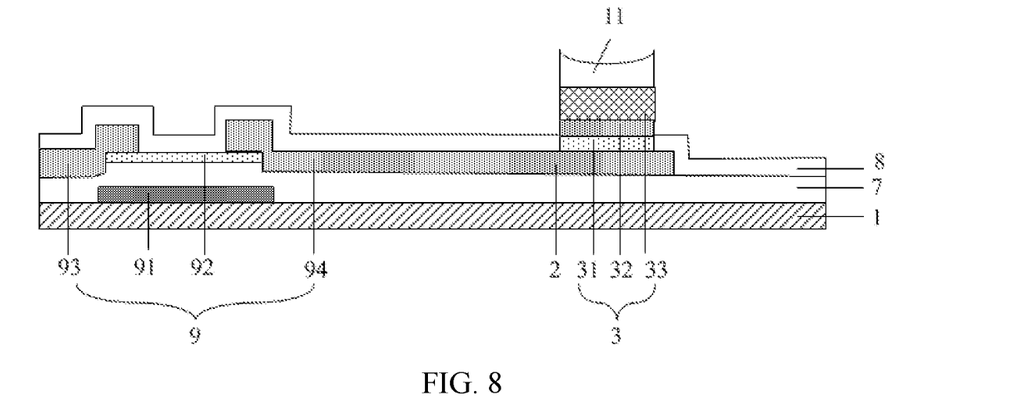
FIG. 8 is a schematic cross-sectional view showing a structure obtained by forming a photoresist layer on the basis of the structure of FIG. 7.

Step ④, forming a first photoresist layer 11 on the P-type semiconductor layer 33. Then, a side of the first photoresist layer 11 facing away from the P-type semiconductor is patterned into a curved shape through exposure, development, and etching using a mask. In the case of a concave arced surface, the film thickness of the first photoresist layer 11 is thin at the center and gradually thickened toward the edge, as shown in FIG. 8. In the case of a convex arced surface, the film thickness of the first photoresist layer 11 is thick at the center and gradually thinned toward the edge.

Figure 9:
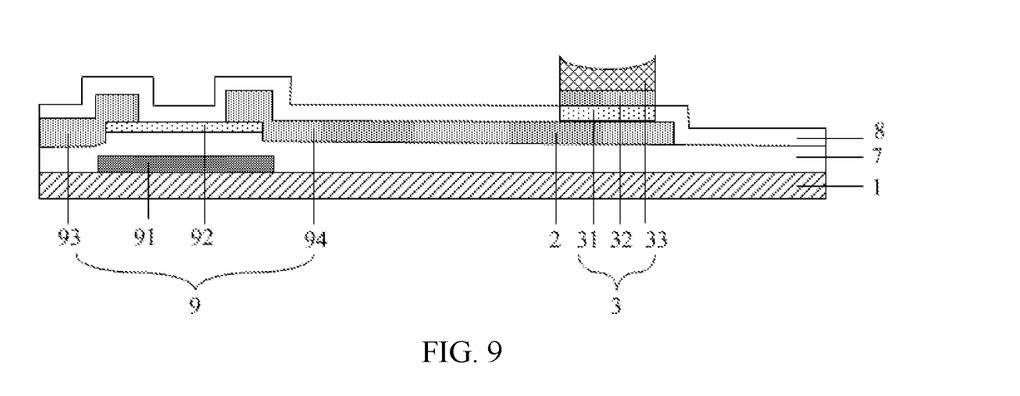
FIG. 9 is a schematic cross-sectional view showing a structure obtained by forming a curved surface of the photosensitive layer on the basis of the structure of FIG. 8.

Step ⑤, performing dry etching to remove the photoresist layer 11 and to cause an upper surface of the P-type semiconductor layer 33 to be formed into a desired curved surface, such as a concave arced surface, as shown in FIG. 9. The dry etching may include multiple cycles of etching and ashing. The curvature of the curved surface may be adjusted by adjusting the number of cycles.

The etching of the P-type semiconductor layer 33 requires that the minimum thickness of the P-type semiconductor layer 33 be greater than a threshold so as not to affect the normal operation of the PIN photodiode. It should be noted that negative influence arise from the uneven thickness of the P-type semiconductor layer 33 is negligible because the performance of photoelectric conversion of the PIN photodiode is mainly determined by the I layer (i.e., the intrinsic semiconductor layer 32).

At step S103, the second electrode 4 is formed on the photosensitive layer 3. This may include multiple sub-steps.

Figure 10:
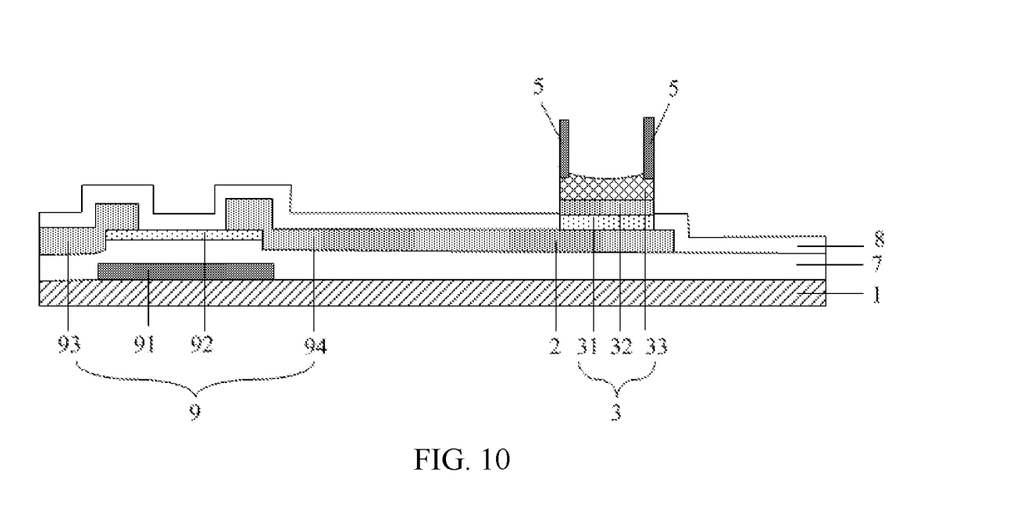
FIG. 10 is a schematic cross-sectional view showing a structure obtained by forming a loop-shaped frame on the basis of the structure of FIG. 9.

Step ⑥, forming a metal layer on the P-type semiconductor layer 33, and providing a through-hole in the metal layer to form the loop-shaped frame 5, as shown in FIG. 10. Specifically, a second photoresist layer may be formed on the metal layer, and then the pattern of the loop-shaped frame 5 is formed through exposure, development and etching using a mask. The metal layer may include a metal such as Mo, Al, Nb or Ti, or an alloy of any combination of the above metals. In this step, the etching may be dry etching. Due to the etch anisotropy of the dry etching, the loop-shaped frame 5 produced may have walls as perpendicular as possible.

Figure 11:
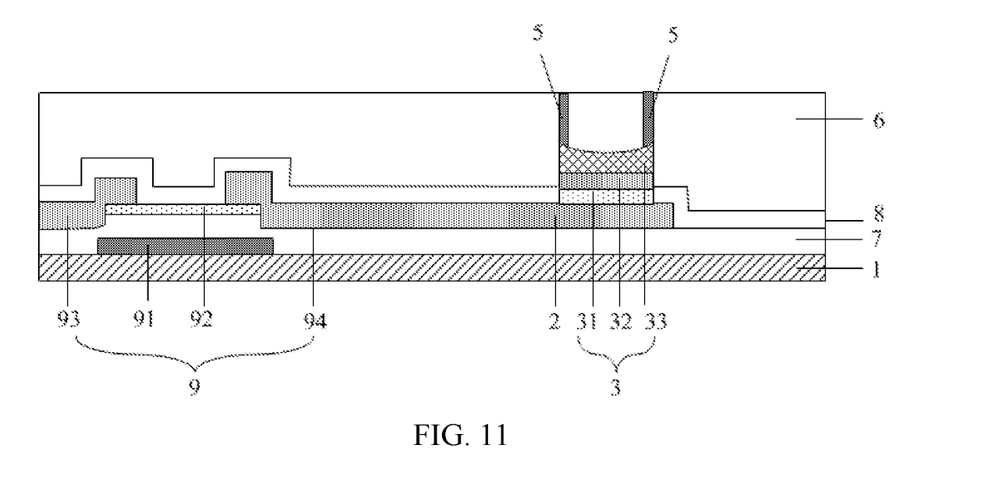
FIG. 11 is a schematic cross-sectional view showing a structure obtained by depositing an insulating layer on the basis of the structure of FIG. 10.

Step ⑦, depositing the insulating layer 6 on the structure shown in FIG. 10 to obtain a structure as shown in FIG. 11. Then, a via (not shown) for connecting the second electrode 4 and the P-type semiconductor layer 33 is provided in the insulating layer 6.

Figure 12:
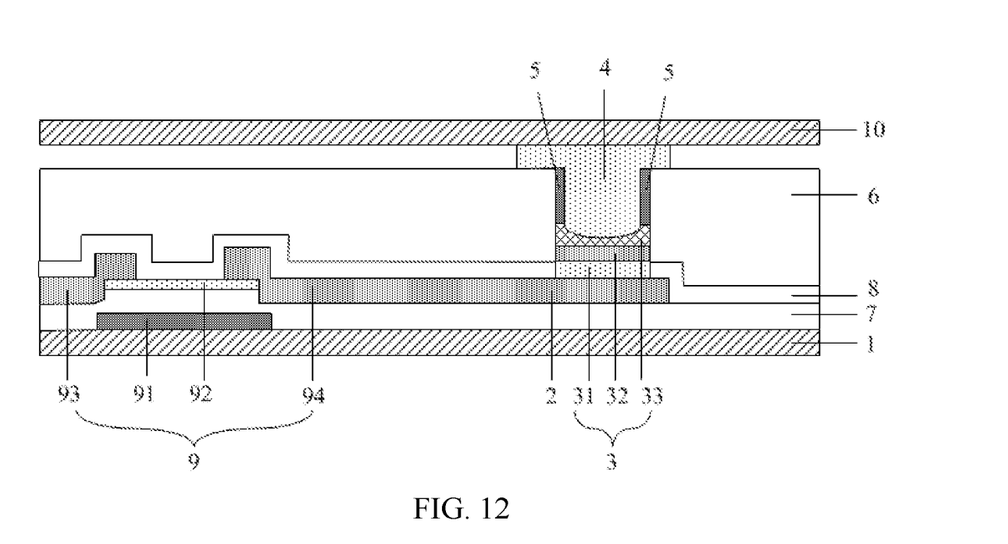
FIG. 12 is a schematic cross-sectional view showing a structure obtained by forming a second electrode on the basis of the structure of FIG. 10.

Step ⑧, filling an electrode material in the via in the insulating layer 6 to form the second electrode 4, as shown in FIG. 12. Specifically, the second electrode 4 and the pixel electrodes (not shown) may be manufactured synchronously using a mask. Thus, manufacture of an entire fingerprint recognition sensor is completed. Also shown in FIG. 12 is the second substrate 10 on the second electrode 4.

In embodiments, by setting the side of the photosensitive layer 3 facing away from the first electrode 2 to be curved, the light receiving area of the fingerprint recognition device can be increased, thereby improving the sensitivity and accuracy of the fingerprint recognition device.

It is apparent that various modifications and variations can be made by those skilled in the art to the present disclosure without departing from the scope of the present disclosure. Thus, should such modifications and variations to the present disclosure fall within the scope of the claims of the present disclosure and equivalents thereof, the present disclosure is intended to encompass the modifications and variations.

What is claimed is:

1. A fingerprint recognition device, comprising:
a first substrate; and
at least one photosensitive detector on the first substrate, each of the at least one photosensitive detector comprising a first electrode, a photosensitive layer on the first electrode, and a second electrode on the photosensitive layer,
wherein a side of the photosensitive layer facing away from the first electrode has a curved shape,
wherein each of the at least one photosensitive detector further comprises a respective loop-shaped frame on the photosensitive layer, and wherein the loop-shaped frame has a reflective inner surface such that light impinging on the inner surface is reflected to the photosensitive layer, and
wherein the loop-shaped frame surrounds at least a portion of the second electrode, and wherein the second electrode is in contact with the photosensitive layer via the at least the portion surrounded by the loop-shaped frame.

2. The fingerprint recognition device of claim 1, wherein the photosensitive layer comprises:
an N-type semiconductor layer;
an intrinsic semiconductor layer on the N-type semiconductor layer; and
a P-type semiconductor layer on the intrinsic semiconductor layer,
wherein a side of the P-type semiconductor layer facing away from the first electrode has the curved shape.

3. The fingerprint recognition device of claim 2, wherein the curved shape comprises at least one selected from a group consisting of a concave arced surface, a convex arced surface, and a wavy surface.

4. The fingerprint recognition device of claim 1, wherein the loop-shaped frame is arranged such that an orthographic projection of the loop-shaped frame onto the first substrate overlaps an orthographic projection of a peripheral region of the photosensitive layer onto the first substrate.

5. The fingerprint recognition device of claim 1, further comprising a second substrate opposite the first substrate and on the second electrode.

6. The fingerprint recognition device of claim 1, further comprising at least one thin film transistor on the first substrate, wherein each of the at least one thin film transistor is electrically connected to the first electrode of a respective photosensitive detector of the at least one photosensitive detector to transfer an output signal from the respective photosensitive detector for fingerprint recognition.

7. A display panel comprising the fingerprint recognition device of claim 1.

8. The display panel of claim 7, wherein the photosensitive layer comprises:
an N-type semiconductor layer;
an intrinsic semiconductor layer on the N-type semiconductor layer; and
a P-type semiconductor layer on the intrinsic semiconductor layer,
wherein a side of the P-type semiconductor layer facing away from the first electrode has the curved shape.

9. The display panel of claim 8, wherein the curved shape comprises at least one selected from a group consisting of a concave arced surface, a convex arced surface, and a wavy surface.

10. The display panel of claim 7, wherein the loop-shaped frame is arranged such that an orthographic projection of the loop-shaped frame onto the first substrate overlaps an orthographic projection of a peripheral region of the photosensitive layer onto the first substrate.

11. The display panel of claim 7, wherein the loop-shaped frame is made of a material comprising at least one selected from a group consisting of Mo, Al, Nb, and Ti.

12. A method of manufacturing a the fingerprint recognition device according to claim 1, comprising:
forming the first electrode on the first substrate;
forming the photosensitive layer on the first electrode;
patterning the side of the photosensitive layer facing away from the first electrode into the curved shape; and
forming the second electrode on the patterned photosensitive layer.

13. The method of claim 12, wherein the photosensitive layer comprises an N-type semiconductor layer, an intrinsic semiconductor layer on the N-type semiconductor layer, and a P-type semiconductor layer on the intrinsic semiconductor layer, and wherein the patterning comprises:
forming a photoresist layer on the P-type semiconductor layer;
patterning a side of the photoresist layer facing away from the P-type semiconductor layer into the curved shape; and
performing dry etching to remove the photoresist layer and to etch a side of the P-type semiconductor layer facing away from the first electrode into the curved shape.

14. The method of claim 13, wherein the dry etching comprises a plurality of cycles of etching and ashing.

15. The method of claim 13, wherein the dry etching is performed such that the P-type semiconductor layer has a minimum thickness greater than a threshold.

16. A fingerprint recognition device, comprising:
a first substrate; and
at least one photosensitive detector on the first substrate, each of the at least one photosensitive detector comprising a first electrode, a photosensitive layer on the first electrode, and a second electrode on the photosensitive layer,
wherein a side of the photosensitive layer facing away from the first electrode has a curved shape,
wherein each of the at least one photosensitive detector further comprises a respective loop-shaped frame on the photosensitive layer, and wherein the loop-shaped frame has a reflective inner surface such that light impinging on the inner surface is reflected to the photosensitive layer, and
wherein the loop-shaped frame is made of a material comprising at least one selected from a group consisting of Mo, Al, Nb, and Ti.

* * * * *